(12) United States Patent
Willshere et al.

(10) Patent No.: US 10,682,848 B2
(45) Date of Patent: Jun. 16, 2020

(54) WORKPIECE PROCESSING SYSTEM AND METHOD

(75) Inventors: Richard Willshere, Dorchester (GB);
Martyn Buttle, Martinstown (GB);
Mick Bartholomew, Weymouth (GB);
John Bruce Knowles, Wimborne (GB);
Darren Brown, Weymouth (GB)

(73) Assignee: ASM ASSEMBLY SYSTEMS SINGAPORE PTE. LTD., Singapore (SG)

( * ) Notice: Subject to any disclaimer, the term of this patent is extended or adjusted under 35 U.S.C. 154(b) by 1930 days.

(21) Appl. No.: 12/676,261

(22) PCT Filed: Sep. 3, 2008

(86) PCT No.: PCT/GB2008/002980
§ 371 (c)(1),
(2), (4) Date: Nov. 9, 2010

(87) PCT Pub. No.: WO2009/030899
PCT Pub. Date: Mar. 12, 2009

(65) Prior Publication Data
US 2011/0041716 A1    Feb. 24, 2011

(30) Foreign Application Priority Data
Sep. 3, 2007 (GB) .................................. 0716999.8

(51) Int. Cl.
*H05K 13/00* (2006.01)
*B41F 15/08* (2006.01)
(52) U.S. Cl.
CPC ......... *B41F 15/08* (2013.01); *H05K 13/0061* (2013.01)
(58) Field of Classification Search
CPC ..... B21L 339/30; B25J 9/0093; B25J 9/0096; B25J 9/02; B25J 9/105; B25J 9/109;
(Continued)

(56) References Cited

U.S. PATENT DOCUMENTS 3,485,339 A * 12/1969 Miller et al. ............... 198/460.1
3,512,662 A * 5/1970 Strydom ..................... 414/323
(Continued)

FOREIGN PATENT DOCUMENTS

EP    0 444 397    9/1991
EP    1 595 698    11/2005
(Continued)

OTHER PUBLICATIONS

International Search Report for corresponding application PCT/GB2008/002980 dated Jan. 30, 2009.

*Primary Examiner* — Saul Rodriguez
*Assistant Examiner* — Brendan P Tighe
(74) *Attorney, Agent, or Firm* — Renner, Otto, Boisselle & Sklar, LLP (57) ABSTRACT

A workpiece processing system and method, the workpiece processing system comprising at least one workpiece processing module (3), each workpiece processing module comprising: a workpiece processing unit (11) for processing workpieces (W); and a feed unit (37) which is operable to transfer workpieces to and from the workpiece processing unit, wherein the feed unit comprises input and output feed assemblies (38, 39) which are operable to transfer workpieces to and from the workpiece processing unit and a processing zone feed assembly (40) which interconnects the input and output feed assemblies and is operable to transfer workpieces from the input feed assembly (38) to the workpiece processing unit and from the workpiece processing unit to the output feed assembly (39).

32 Claims, 10 Drawing Sheets

(58) Field of Classification Search
CPC ...... B25J 15/06; B25J 15/0616; B25J 19/021;
B25J 19/022; B41F 15/0818; B65G
37/00; B65G 47/248; B65G 47/252;
B65G 47/52; B65G 47/90; B65G 47/91;
B65G 2047/00; B65G 2047/52; H01L
21/4867; H01L 21/6715; H01L 21/67155;
H01L 21/67173; H01L 21/67259; H01L
21/67276; H01L 21/677; H01L 21/67703;
H01L 21/67706; H01L 21/67715; H01L
21/67736; H01L 21/67739; H01L
21/67742; H01L 21/67748; H01L
21/6776; H01L 21/67763; H01L 21/68;
H01L 21/681; H01L 21/6838; H01L
2224/0332; H01L 2224/74; H05K 3/1216;
H05K 3/1233; H05K 3/82104; H05K
2203/0126; H05K 2203/0139; H05K
2203/0165; H05K 2203/1572; H05K
2203/1581; B21B 39/30
USPC ............. 198/341.01, 341.08, 346.2, 377.01,
198/377.02, 343.1, 575, 576, 577, 579,
198/602, 605, 626.1, 626.2; 414/222.01,
414/222.06, 222.09, 222.11, 225.01,
414/744.1, 744.2, 744.3, 744.4, 751.1,
414/752.1, 758, 761, 764, 767, 935, 936,
414/937; 427/96.1, 96.9, 98.4, 282
See application file for complete search history.

(56) References Cited

U.S. PATENT DOCUMENTS

| | | | |
|---|---|---|---|
| 3,610,397 A * | 10/1971 | Bok | 198/404 |
| 3,949,194 A * | 4/1976 | Catto et al. | 235/475 |
| 4,144,960 A * | 3/1979 | Scourtes | 198/346.1 |
| 4,921,092 A * | 5/1990 | Crawford et al. | 198/460.1 |
| 5,297,568 A * | 3/1994 | Schmid | 134/62 |
| 5,314,711 A * | 5/1994 | Baccini | 427/98.2 |
| 5,436,028 A | 7/1995 | Becher | |
| 5,460,257 A * | 10/1995 | Yoshida | 198/358 |
| 5,648,907 A * | 7/1997 | Taijonlahti et al. | 700/96 |
| 5,730,051 A | 3/1998 | Takahashi et al. | |
| 5,732,623 A * | 3/1998 | Compera et al. | 101/232 |
| 5,768,143 A * | 6/1998 | Fujimoto | 700/235 |
| 5,782,399 A * | 7/1998 | Lapastora | 228/41 |
| 5,806,999 A * | 9/1998 | Kobayashi | 400/188 |
| 5,843,621 A * | 12/1998 | Schafer | 430/273.1 |
| 5,906,158 A | 5/1999 | Takai | 101/123 |
| 5,927,713 A * | 7/1999 | Driscoll et al. | 271/298 |
| 5,988,487 A * | 11/1999 | MacKay et al. | 228/254 |
| 6,032,577 A | 3/2000 | Doyle | |
| 6,063,191 A * | 5/2000 | Kuster | 118/218 |
| 6,073,342 A | 6/2000 | Asai et al. | |
| 6,089,763 A | 7/2000 | Choi et al. | |
| 6,115,939 A * | 9/2000 | Kuster | 34/194 |
| 6,203,268 B1 * | 3/2001 | Miyashita | 414/757 |
| 6,253,906 B1 * | 7/2001 | Hall | 198/460.1 |
| 6,408,745 B1 | 6/2002 | Topolewski | |
| 6,517,895 B1 * | 2/2003 | Wolfer et al. | 427/96.9 |
| 6,609,652 B2 | 8/2003 | MacKay et al. | 228/254 |
| 6,662,931 B2 * | 12/2003 | Bruun et al. | 198/617 |
| 6,705,454 B2 * | 3/2004 | Fishaw et al. | 198/571 |
| 7,108,121 B2 * | 9/2006 | Fujimura et al. | 198/347.1 |
| 7,128,521 B2 * | 10/2006 | Hansl | 414/807 |
| 7,225,734 B2 | 6/2007 | Schanz | |
| 7,318,516 B2 * | 1/2008 | Tani et al. | 198/575 |
| 7,604,153 B2 * | 10/2009 | MacKay et al. | 228/248.1 |
| 7,833,351 B2 * | 11/2010 | Webb et al. | 118/719 |
| 7,842,599 B2 * | 11/2010 | Mackay | 438/616 |
| 8,042,677 B2 * | 10/2011 | Konig et al. | 198/460.1 |
| 8,327,761 B2 * | 12/2012 | Miyahara et al. | 101/126 |
| 8,375,852 B2 * | 2/2013 | Miyahara et al. | 101/123 |
| 8,382,088 B2 * | 2/2013 | Kondoh | 118/719 |
| 8,497,057 B2 * | 7/2013 | Tombs et al. | 430/120.2 |
| 8,499,688 B2 * | 8/2013 | Miyahara et al. | 101/123 |
| 2003/0040830 A1 | 2/2003 | Parikh et al. | |
| 2003/0185656 A1 * | 10/2003 | Hansl | 414/277 |
| 2004/0247417 A1 | 12/2004 | Fujimura et al. | |
| 2007/0068628 A1 * | 3/2007 | Uchino et al. | 156/345.32 |
| 2007/0141263 A1 * | 6/2007 | Schaefer | 427/355 |
| 2009/0299521 A1 | 12/2009 | Hansl et al. | |
| 2011/0182702 A1 * | 7/2011 | Hashimoto | 414/222.07 |
| 2011/0290185 A1 * | 12/2011 | Ihara et al. | 118/724 |
| 2012/0110843 A1 * | 5/2012 | Tombs et al. | 29/847 |

FOREIGN PATENT DOCUMENTS

| | | |
|---|---|---|
| JP | 56/084962 A | 7/1981 |
| JP | 59/214293 A | 12/1984 |
| JP | 03/082569 A | 4/1991 |
| JP | 07/205399 A | 8/1995 |
| JP | 08/115966 A | 5/1996 |
| JP | 08/300613 A | 11/1996 |
| JP | 3255783 B | 11/2001 |
| JP | 2003/174299 A | 6/2003 |
| JP | 2004/265887 A | 9/2004 |
| JP | 2004/281983 A | 10/2004 |
| JP | 2004/363312 A | 12/2004 |
| JP | 2005/047065 A | 2/2005 |
| JP | 2005/193548 A | 7/2005 |
| JP | 2005/525953 A | 9/2005 |
| JP | 2007/053264 A | 3/2007 |
| JP | 2007/053939 A | 3/2007 |
| JP | 2007/123918 A | 5/2007 |
| JP | 2007/184498 A | 7/2007 |
| WO | 00/34043 | 6/2000 |
| WO | WO 2006042347 A2 * | 4/2006 ............ B65G 1/1373 |
| WO | 2007/020809 A1 | 2/2007 |

* cited by examiner

WORKPIECE PROCESSING SYSTEM AND METHOD

This application is a national phase of International Application No. PCT/GB2008/002980 filed Sep. 3, 2008 and published in the English language.

The present invention relates to a workpiece processing system for and method of processing workpieces, in particular substrates, and more particularly electronic substrates, such as printed circuit boards and wafers, including solar cell wafers, and in particular a screen printing system for and method of printing workpieces.

The general drive in the electronics industry towards complex multi-layer substrates, greater component population on substrates and increased interconnectivity within substrates creates greater demands on the processing operations, in particular the printing operation, both in terms of accuracy and throughput.

SMT manufacturing comprises three basic processes, namely, printing of material deposits on a substrate, including printing of solder deposits, placement of components on the printed substrate and re-flow of the printed deposits.

The manufacturing equipment comprises machines in an in-line configuration, which are interconnected by conveyors which pass through the machines, with the substrates first passing to a printing machine for the printing of material deposits, then to a pick-and-place machine at which components are placed on the printed substrate, and finally a re-flow machine where the assembly is rendered homogeneous.

Recent developments to increase throughput and satisfy the increasing demands in productivity have been to increase the output of the various machines. This has been achieved by shortening the time of each of the machine operations and the time between operations, and also providing multiple tracks through the machines. In such multiple-track printing machines, the printing screen includes a plurality of images, one for each track, which allow patterns of deposit to be printed simultaneously on multiple substrates in a single printing operation.

Whilst such multi-track printing machines have provided for increased throughput, there is a limit to the increase in throughput which is possible, given the sequential processing of the workpieces in using a single printing screen.

Solar cell manufacturing requires the printing of images on the upper and lower sides of wafers, and the subsequent firing of the printed wafers. Typically, one image is printed on the upper side of a wafer and two images are printed on the underside of a wafer.

For such processing, a conventional production line includes nine separate processing machines, these being a wafer loader for loading wafers onto the production line, a first printer for printing a first print onto one side of a wafer, a first dryer for drying the printed wafer, a flipper for inverting the wafer, a second printer for printing a second print onto the other side of the wafer, a second dryer for drying the printed wafer, a third printer for printing a third print onto the other side of the wafer, a firing furnace for firing the printed wafer and an unloader for unloading finished wafers from the production line. Not only are a large number of separate machines required, but these require a large area.

Recently, a hot-melt printing process has been developed for the printing of contact fingers on solar cell wafers, which eliminates the need for the drying operations. The use of hot-melt printing reduces the number of separate machines to seven, in not requiring the conventional dryers, but still a large number of machines are required, which require a large area.

It is an aim of the present invention to provide a workpiece processing system and method, in particular a workpiece printing system and method, which allows for a high throughput of workpieces.

It is another aim of the present invention to provide a workpiece processing system and method, in particular a workpiece printing system and method, which comprises a plurality of workpiece-processing modules and provides for versatility in configuring the processing paths for the workpieces, such as in balancing the loads of workpiece-processing modules where the workpiece-processing modules provide for different kinds of workpiece processing, for example, printing and ball-placement, and, where more than one output line is supplied with workpieces, providing workpieces in different numbers to respective output lines.

It is also a particular aim of the present invention to provide a workpiece printing system and method, which provides for the printing of wafers, in particular solar cell wafers, by a single machine that is of a size similar to a conventional printer, thereby considerably reducing the space required for production.

In one aspect the present invention provides a workpiece processing system comprising at least one workpiece processing module, each workpiece processing module comprising: a workpiece processing unit for processing workpieces; and a feed unit which is operable to transfer workpieces to and from the workpiece processing unit, wherein the feed unit comprises input and output feed assemblies which are operable to transfer workpieces to and from the workpiece processing unit and a processing zone feed assembly which interconnects the input and output feed assemblies and is operable to transfer workpieces from the input feed assembly to the workpiece processing unit and from the workpiece processing unit to the output feed assembly.

In another aspect the present invention provides a workpiece processing system comprising a plurality of workpiece processing modules, each comprising a workpiece processing unit for processing workpieces and a feed unit which is operable to transfer workpieces to and from the workpiece processing unit.

The present invention also extends to a method of processing workpieces using the above-described workpiece processing system.

In a further aspect the present invention provides a method of processing workpieces, comprising the steps of: providing at least one workpiece processing module, each module comprising a workpiece processing station, input and output feed assemblies for transferring workpieces to and from the workpiece processing station, and a processing zone feed assembly which interconnects the input and output feed assemblies for transferring workpieces from the input feed assembly to the workpiece processing station and from the workpiece processing station to the output feed assembly; feeding workpieces to the at least one workpiece processing module on the input feed assembly; feeding workpieces from the at least one workpiece processing module on the output feed assembly; and feeding workpieces from the input feed assembly to the workpiece processing station and to the output feed assembly on the processing zone feed assembly.

In a still further aspect the present invention provides a method of processing workpieces, comprising the steps of: providing a plurality of workpiece processing modules, each comprising a workpiece processing unit for processing workpieces; and transferring workpieces to and from the workpiece processing unit.

Preferred embodiments of the present invention will now be described hereinbelow by way of example only with reference to the accompanying drawings, in which:

FIGS. 1 to 4 illustrate a workpiece-processing system, in this embodiment a screen printing system, in accordance with a first embodiment of the present invention.

Figure 1:
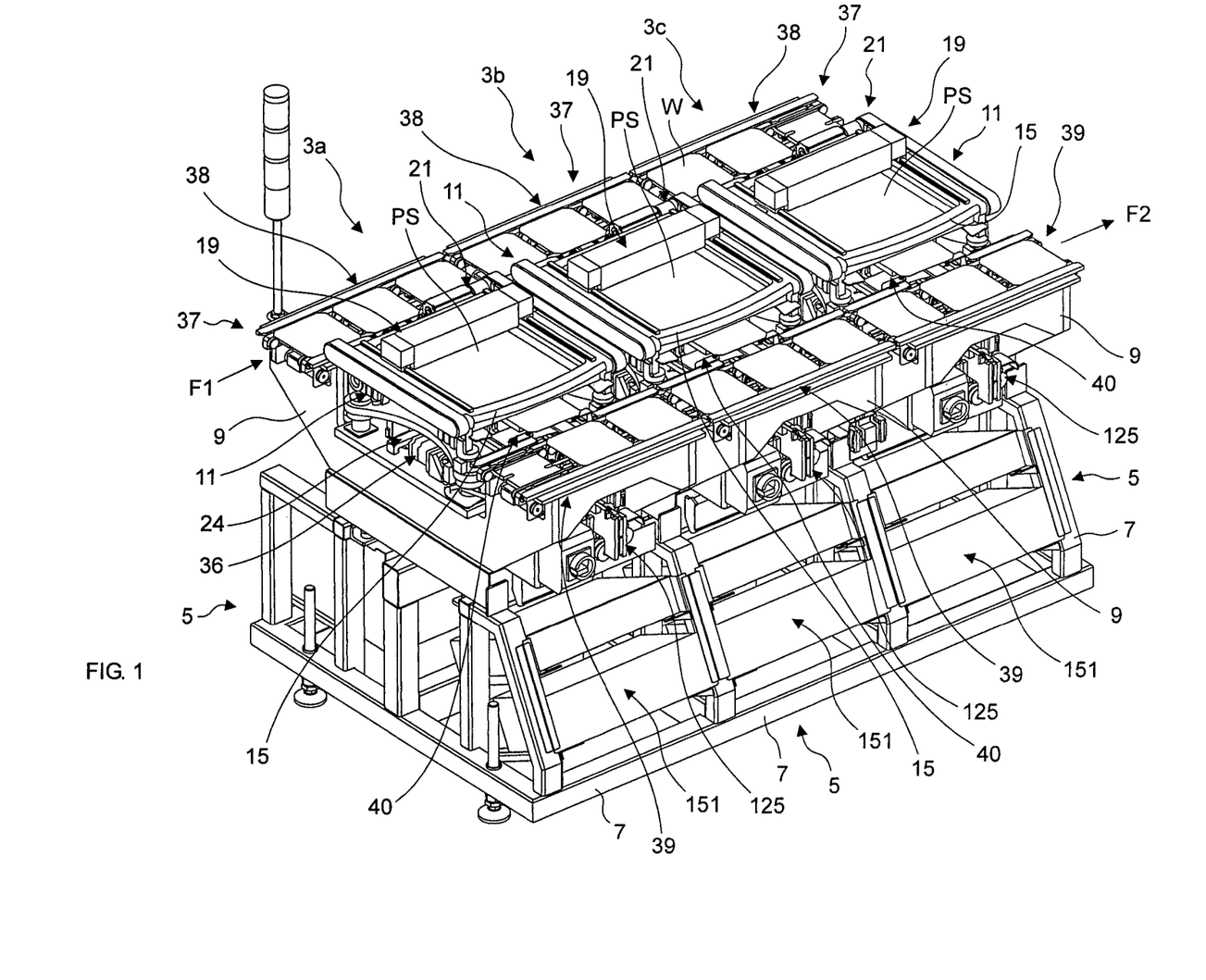
FIG. 1 illustrates a perspective view of a screen printing system in accordance with a first embodiment of the present invention.

The screen printing system comprises at least one workpiece-processing module 3, in this embodiment a plurality of workpiece-processing modules 3a, 3b, 3c, here print modules, which are disposed in parallel relation and each separably operable to print deposits of a print medium onto workpieces W.

Each print module 3a, 3b, 3c comprises a support unit 5, which comprises a lower, base support member 7, in this embodiment a frame member, which rests on the ground, and an upper support member 9, in this embodiment a frame member, which is mounted on the lower support member 7.

In this embodiment the lower support members 7 of the print modules 3a, 3b, 3c are provided as a single integral structure. In an alternative embodiment the lower support members 7 of the print modules 3a, 3b, 3c could be separate structures which are fixed together, such as fixed together by fixing bolts.

In this embodiment the upper support members 9 of the print modules 3a, 3b, 3c are provided as separate structures.

Each print module 3a, 3b, 3c further comprises a workpiece-processing unit 11, in this embodiment a print unit, which is mounted to the upper support member 9 and operable to print deposits of a print medium onto successive workpieces W.

The print unit 11 comprises a screen support member 15 for supporting a printing screen PS, a print head 19 which is movable over the printing screen PS to print deposits of a print medium through a pattern of apertures in the printing screen PS and onto a workpiece W supported therebelow, and a drive mechanism 21 for driving the print head 19 over the printing screen PS in a printing operation.

In this embodiment the print head 19 is an enclosed print head, which is driveable in a reciprocating manner over the printing screen PS, such as to print in each of the opposite directions of movement. In alternative embodiments the print head 19 could be of any other suitable design, such as a squeegee, and could be operable such as to print in only one direction of movement.

Figure 2:
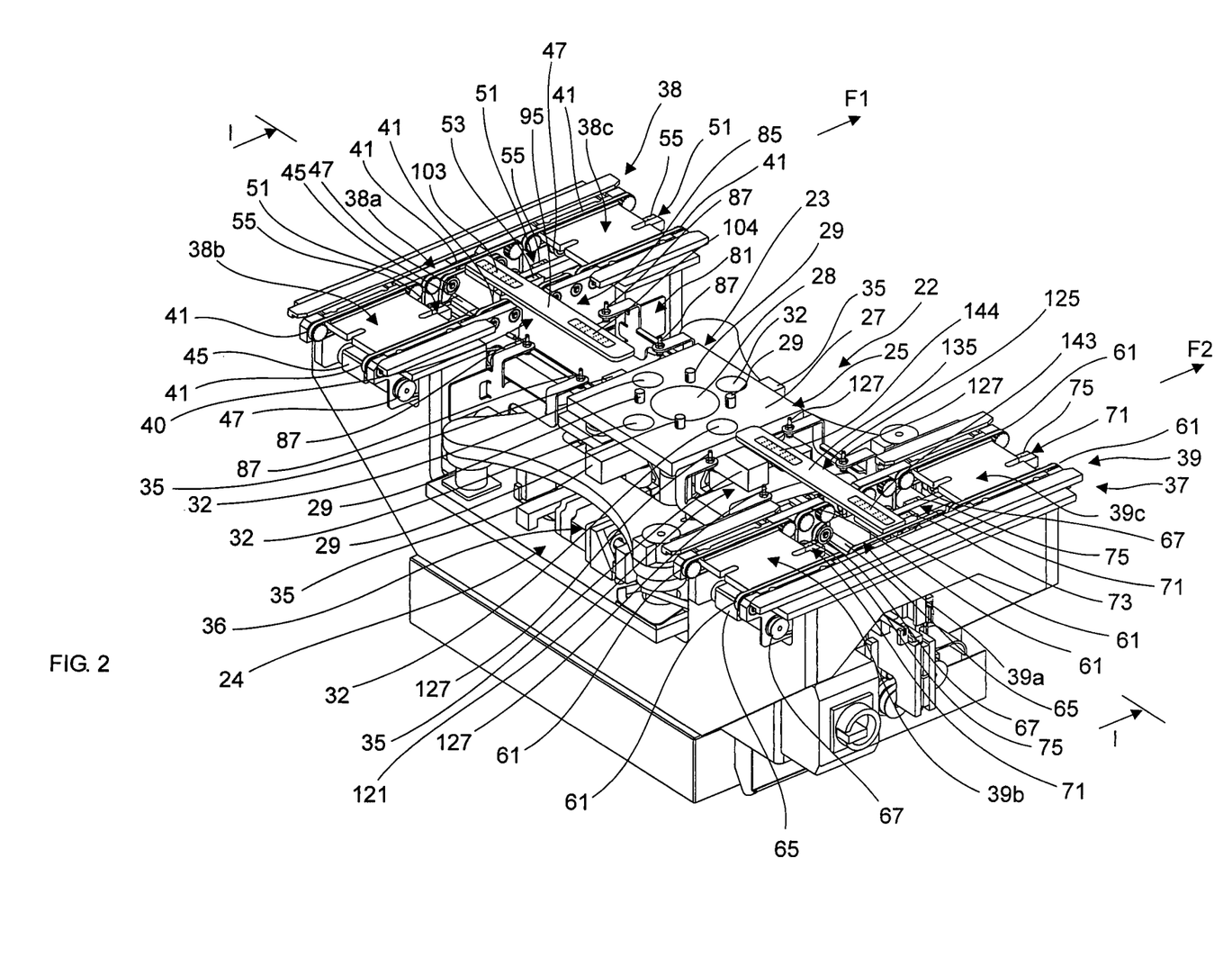
FIG. 2 illustrates an enlarged perspective view of one print module of the screen printing system of FIG. 1, with the print unit removed for ease of reference.
Figure 3:
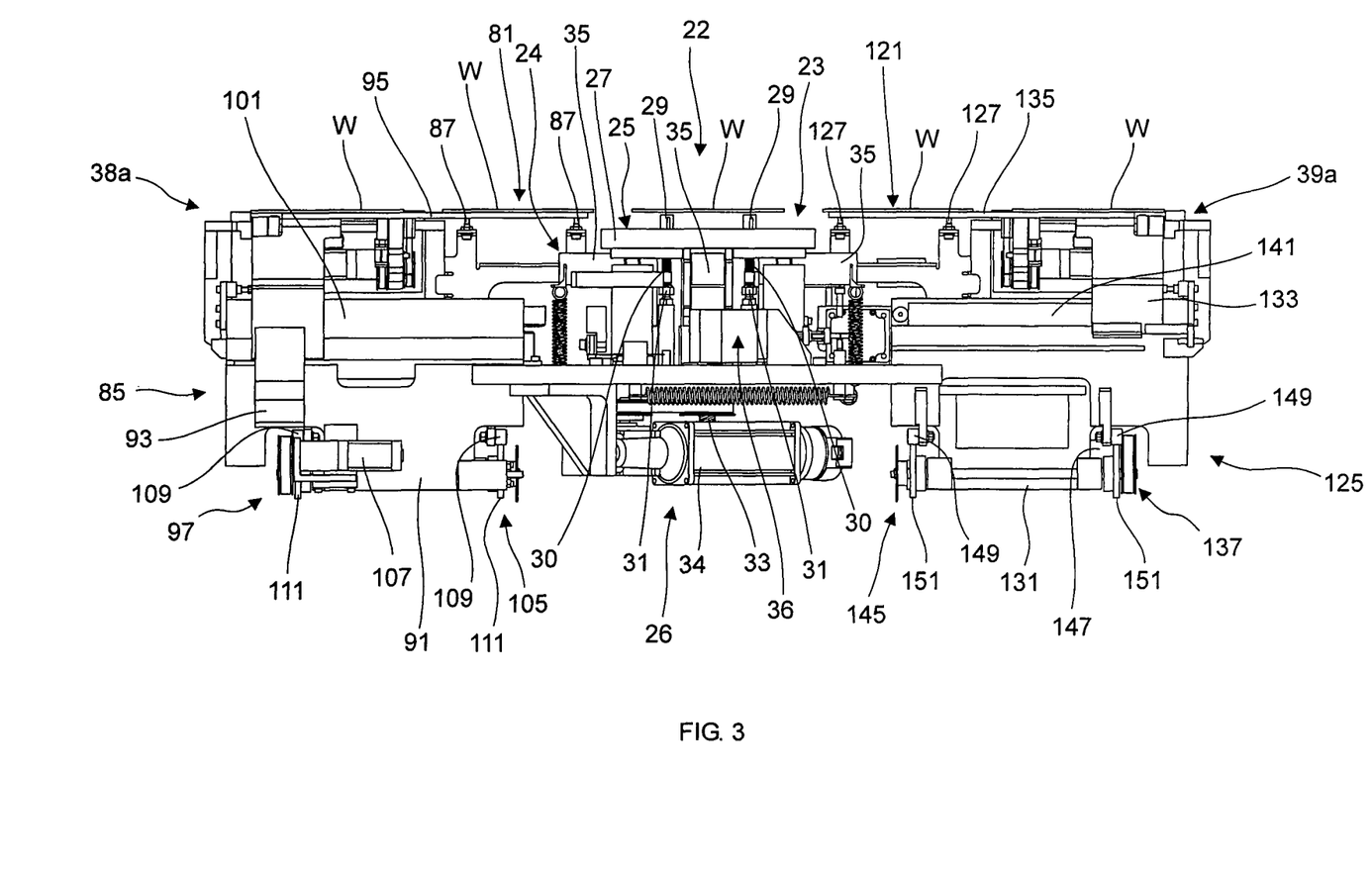
FIG. 3 illustrates a part-sectional longitudinal view (along section I-I) through the print module of FIG. 2.

As particularly illustrated in FIGS. 2 and 3, each print module 3a, 3b, 3c further comprises a workpiece support assembly 22 which receives a workpiece W and supports the same beneath the printing screen PS.

The workpiece support assembly 22 comprises a workpiece support unit 23 which supports a workpiece W, and an alignment mechanism 24 for aligning a supported workpiece W relative to the printing screen PS.

The workpiece support unit 23 comprises a workpiece support member 25, which is movable vertically and provides a print station, and a lifting mechanism 26, which is operable to raise and lower the workpiece support member 25.

In this embodiment the workpiece support member 25 is movable between a first, lowered, loading position, in which the workpiece support member 25 can be loaded with a workpiece W and a second, raised, workpiece-processing, here printing position, in which the workpiece W is set at a position beneath the printing screen PS for printing. The printing system of the present invention allows for both on-contact and off-contact printing.

In this embodiment the workpiece support member 25 comprises a workpiece-processing table 27, here a print table, in this embodiment in the form of a platen, which includes a vacuum section 28, here centrally located, which is operative to hold a workpiece W thereto.

In this embodiment the vacuum section 28 comprises a pad, here a sintered plate, typically a sintered ceramic plate, which is set in the print table 27, such as to define a planar upper surface, and provides for a vacuum at the upper surface thereof on application of a vacuum source to the lower surface thereof.

In this embodiment the workpiece support member 25 further comprises a plurality of workpiece support elements 29, here upstanding pillars, which extend through the print table 27 and are biased downwardly by resilient elements 30, here compression springs.

In this embodiment the resilient elements 30 are configured to act against respective stops 31, such that, when the print table 27 is in the lowered, loading position, the resilient elements 30 are compressed and the workpiece support elements 29 project above the upper surface of the print table 27, such as to receive a workpiece W thereon in spaced relation from the upper surface of the print table 27, and, when the print table 27 is in the raised, printing position, the workpiece support elements 29 are at or below the upper surface of the print table 27, here flush to the upper surface of the print table 27, whereby the lower surface of the workpiece W is fully supported by the upper surface of the print table 27.

In this embodiment the print table 27 includes at least one, here a plurality of windows 32, which allow for a line of sight to edges of a supported workpiece W and alignment marks, often referred to as fiducials, on the lower surface of the printing screen PS.

In this embodiment the lifting mechanism 26 comprises a leadscrew 33, which is threadably coupled to the print table 27, such that rotation of the leadscrew 33 in the opposite, clockwise and counter-clockwise senses causes a respective one of the raising or lowering of the print table 27, and an actuator 34 for rotating the leadscrew 33.

In this embodiment the actuator 34 comprises a drive motor and an associated gearbox assembly.

In this embodiment the alignment mechanism 24 comprises at least one, in this embodiment a plurality of camera units 35, which are configured such as to view edges of a supported workpiece W and the alignment marks on the lower surface of the printing screen PS through respective ones of the windows 32 in the print table 27, and an actuator unit 36 which includes a plurality of actuators, here drive motors, which are operable, in response to the images as acquired by the camera units 35, to correct any misalignment in the supported workpiece W relative to the printing screen PS.

In this embodiment the actuator unit 36 comprises three actuators for positioning the workpiece W in X, Y and θ axes. In other embodiments the actuator unit 36 could comprise any number and arrangement of actuators which are such as to enable alignment of a supported workpiece W relative to the printing screen PS.

In this embodiment the workpiece W is moved in relation to the printing screen PS in order to achieve alignment of the workpiece W relative to the printing screen PS, but in another embodiment the printing screen PS could be moved in relation to the workpiece W in order to achieve alignment of the workpiece W relative to the printing screen PS.

Each print module 3a, 3b, 3c further comprises a feed unit 37 which is mounted to the upper support member 9 and operable to transfer workpieces W to and from the print unit 11.

The feed unit 37 comprises input and output feed assemblies 38, 39, in this embodiment disposed in parallel relation to opposite sides of the print unit 11, which are operable to transfer workpieces W to and from the print module 3a, 3b, 3c, and a print zone feed assembly 40, which interconnects the input and output feed assemblies 38, 39 and is operable to transfer workpieces W from the input feed assembly 38 to the workpiece support member 25 of the workpiece support unit 23 for printing and, following printing, from the workpiece support member 25 of the workpiece support unit 23 to the output feed assembly 39.

In this embodiment the input and output feed assemblies 38, 39 are operable to feed workpieces W in common feed directions F1, F2, but in another embodiment the feed directions F1, F2 could be opposite directions.

As particularly illustrated in FIG. 2, the input feed assembly 38 comprises first, second and third sub-feed assemblies 38a, 38b, 38c, which are individually operable, with the primary function of the input feed assembly 38 being to maintain a workpiece W for transfer to the print zone feed assembly 40 and transfer workpieces W to any downstream print modules 3a, 3b, 3c, as will be described in more detail hereinbelow.

The first, loading sub-feed assembly 38a provides a loading station from which a workpiece W can be loaded into the print unit 11.

The second, upline buffer sub-feed assembly 38b is upstream of the loading sub-feed assembly 38a and provides an upline buffer station which buffers a workpiece W for transfer downstream to the loading sub-feed assembly 38a.

The third, downline buffer sub-feed assembly 38c is downstream of the loading sub-feed assembly 38a and provides a downline buffer station which buffers a workpiece W for transfer downstream.

Each of the sub-feed assemblies 38a, 38b, 38c comprises a pair of drive elements 41, 41, in this embodiment belts, here toothed belts, which are disposed in spaced, parallel relation such as to engage the opposite, lower edges of a workpiece W, and an actuator 45, in this embodiment a drive motor, which is commonly coupled, in this embodiment by a pulley arrangement 47, to the drive elements 41, 41, such that the drive elements 41, 41 are commonly driven by the actuator 45.

In this embodiment the inner drive element 41 of the first, loading sub-feed assembly 38a is configured, here by an arrangement of pulleys, such as to comprise first and second spaced drive element sections, which accommodate a walking beam 95 therebetween, as will be described in more detail hereinbelow.

Each of the sub-feed assemblies 38a, 38b, 38c further comprises a sensor unit 51 which comprises first and second sensors 53, 55, which are disposed in downstream relation in the input feed direction F1. The sensors 53, 55 are configured such that the actuator 45 drives the drive elements 41, 41 at a first, transfer speed until the leading edge of a workpiece W is detected by the first, upstream sensor 53, on detection of the leading edge of the workpiece W by the first sensor 53, the actuator 45 drives the drive elements 41, 41 at a second, slower speed, which allows for accurate positioning of the workpiece W, and, on detection of the leading edge of the workpiece W by the second, downstream sensor 55, the actuator 45 is stopped to position the workpiece W at the required position.

The output feed assembly 39 comprises first, second and third sub-feed assemblies 39a, 39b, 39c, which are individually operable, with the primary function of the output feed assembly 39 being to receive workpieces W from the print zone feed assembly 40 and transfer the same downstream, as will be described in more detail hereinbelow.

The first, unloading sub-feed assembly 39a provides an unloading station to which a workpiece W is unloaded from the print unit 11.

The second, upline buffer sub-feed assembly 39b is upstream of the unloading sub-feed assembly 39a and provides an upline buffer station which buffers a workpiece W for transfer downstream.

The third, downline buffer sub-feed assembly 39c is downstream of the unloading sub-feed assembly 39a and provides a downline buffer station which buffers a workpiece W for transfer downstream.

Each of the sub-feed assemblies 39a, 39b, 39c comprises a pair of drive elements 61, 61, in this embodiment belts, here toothed belts, which are disposed in spaced parallel relation such as to engage the opposite, lower edges of a workpiece W, and an actuator 65, in this embodiment a drive motor, which is commonly coupled, in this embodiment by a pulley arrangement 67, to the drive elements 61, 61, such that the drive elements 61, 61 are commonly driven by the actuator 65.

In this embodiment the inner drive element 61 of the first, unloading sub-feed assembly 39a is configured, here by an arrangement of pulleys, such as to comprise first and second spaced drive element sections, which accommodate a walking beam 125 therebetween, as will be described in more detail hereinbelow.

Each of the sub-feed assemblies 39a, 39b, 39c further comprises a sensor unit 71 which comprises first and second sensors 73, 75 which are disposed in downstream relation in the output feed direction F2. The sensors 73, 75 are configured such that the actuator 65 drives the drive elements 61, 61 at a first, transfer speed until the leading edge of a workpiece W is detected by the first, upstream sensor 73, on detection of the leading edge of the workpiece W by the first sensor 73, the actuator 65 drives the drive elements 61, 61 at a second, slower speed, which allows for accurate positioning of the workpiece W, and, on detection of the leading edge of the workpiece W by the second, downstream sensor 75, the actuator 65 is stopped to position the workpiece W at the required position.

As particularly illustrated in FIGS. 2 and 3, the print zone feed assembly 40 comprises an input transfer station 81, which is disposed adjacent, in this embodiment inwardly adjacent, the loading station 38a, and an input transfer unit 85, which is operable to transfer workpieces W from the loading station 38a to the input transfer station 81 and from the input transfer station 81 to the printing station.

In this embodiment the input transfer station 81 comprises a plurality of workpiece support elements 87, here four fixed, upstanding pillars which are arranged in the form of a square. In alternative embodiments any number and configuration of workpiece support elements 87 could be utilized which support the workpieces W.

In this embodiment the input transfer unit 85 is operable to transfer a first workpiece W from the loading station 38a to the input transfer station 81 and a second workpiece W from the input transfer station 81 to the print station, and in this embodiment the input transfer unit 85 is configured such as to transfer the first and second workpieces W simultaneously.

In this embodiment the input transfer unit 85 is a walking-beam assembly, which comprises a fixed, main support 91, a movable body 93 which is movable relative to the main support 91 and includes a horizontal, walking beam 95, in this embodiment at an upper surface of the movable body 93, a lifting mechanism 97 for raising and lowering the movable body 93, and a drive mechanism 101 for moving the movable support 93 horizontally.

In this embodiment the movable body 93 is supported on the main support 91 by bearings, which allow for vertical and horizontal sliding of the movable body 93 relative to the main support 91.

In this embodiment the walking beam 95 includes first and second vacuum sections 103, 104, which allow for holding of workpieces W thereto by vacuum.

In this embodiment the vacuum sections 103, 104 comprise a plurality of apertures, which extend to the upper surface of the walking beam 95 and provide for a vacuum thereat on application of a vacuum source thereto.

In this embodiment the lifting mechanism 97 is a cam mechanism which comprises a cam 105 and an actuator 107, in this embodiment a drive motor, which is operable to drive the cam 105 between a first, lowered position in which the movable body 93 is in a first, lowered position, in which position the walking beam 95 is dis-engaged from workpieces W located thereabove, and a second, raised position in which the movable body 93 is in a second, raised position in which the walking beam 95 supports workpieces W located thereabove.

In this embodiment the cam 105 comprises a pair of cam rollers 109, 109 which are mounted to the movable body 93 and a pair of cam members 111, 111, which engage respective ones of the pair of cam rollers 109, 109, which are mounted to the main support 91 and are rotatable by the actuator 107 between the first and second positions.

In this embodiment the drive mechanism 101 is a linear motor, which is operative to move the movable body 93, and hence the walking beam 95, between a first, outer position in which the walking beam 95 extends across the loading station 38a and the input transfer station 81 and a second, inner position in which the walking beam 95 extends across the input transfer station 81 and the print station.

With this configuration, the walking beam 95, when in the outer position, can be raised by operation of the actuator 107, to lift workpieces W from the loading station 38a and the input transfer station 81, moved horizontally to the inner position by the drive mechanism 101 so as to position the workpieces W over respective ones of the input transfer station 81 and the print station, and then lowered, by operation of the actuator 107, to lower the workpieces W onto the input transfer station 81 and the print station.

In an alternative embodiment the input transfer unit 85 could comprise a belt-feed assembly. The walking-beam assembly has the particular advantage of supporting delicate workpieces W, such as substrates used for solar cells and fuel cells which are prone to breaking, particularly in the printing operation.

As particularly illustrated in FIGS. 2 and 3, the print zone feed assembly 40 further comprises an output transfer station 121, which is disposed adjacent, in this embodiment inwardly adjacent, the unloading station 39a, and an output transfer unit 125, which is operable to transfer workpieces W from the print station to the output transfer station 121 and from the output transfer station 121 to the unloading station 39a.

In this embodiment the output transfer station 121 comprises a plurality of workpiece support elements 127, here four fixed, upstanding pillars which are arranged in the form of a square. In alternative embodiments any number and configuration of workpiece support elements 127 could be utilized which support the workpieces W.

In this embodiment the output transfer unit 125 is operable to transfer a first workpiece W from the print station to the output transfer station 121 and a second workpiece W from the output transfer station 121 to the unloading station 39a, and in this embodiment the output transfer unit 125 is configured such as to transfer the first and second workpieces W simultaneously.

In this embodiment the output transfer unit 125 is a walking-beam assembly, which comprises a fixed, main support 131, a movable body 133 which is movable relative to the main support 131 and includes a horizontal, walking beam 135, in this embodiment at an upper surface of the movable body 133, a lifting mechanism 137 for raising and lowering the movable body 133, and a horizontal drive mechanism 141 for moving the movable support 133 horizontally.

In this embodiment the movable body 133 is supported on the main support 131 by bearings, which allow for vertical and horizontal sliding of the movable body 133 relative to the main support 131.

In this embodiment the walking beam 135 includes first and second vacuum sections 143, 144, which allow for holding of workpieces W thereto by vacuum.

In this embodiment the vacuum sections 143, 144 comprise a plurality of apertures, which extend to the upper surface of the walking beam 135 and provide for a vacuum thereat on application of a vacuum source thereto.

In this embodiment the lifting mechanism 137 is a cam mechanism which comprises a cam 145 and an actuator 147, in this embodiment a drive motor, which is operable to drive the cam 145 between a first, lowered position in which the movable body 133 is in a first, lowered position, in which position the walking beam 135 is dis-engaged from workpieces W located thereabove, and a second, raised position in which the movable body 133 is in a second, raised position, in which position the walking beam 135 supports workpieces W located thereabove.

In this embodiment the cam 145 comprises a pair of cam rollers 149, 149 which are mounted to the movable support body 133 and a pair of cam members 151, 151 which are mounted to the main support 131, which engage respective ones of the pair of cam rollers 149, 149 and are rotatable by the actuator 147 between the first and second positions.

In this embodiment the drive mechanism 141 is a linear motor, which is operative to move the movable body 133, and hence the walking beam 135, between a first, inner position in which the walking beam 135 extends across the print station and the output transfer station 121 and a second, outer position in which the walking beam 135 extends across the output transfer station 121 and the unloading station 39*a*.

With this configuration, the walking beam 135, when in the inner position, can be raised by operation of the actuator 147, to lift workpieces W from the print station and the output transfer station 121, moved horizontally to the outer position by the drive mechanism 141 so as to position the workpieces W over respective ones of the output transfer station 121 and the unloading station 39*a*, and then lowered, by operation of the actuator 147, to lower the workpieces W onto the output transfer station 121 and the unloading station 39*a*.

Each print module 3*a*, 3*b*, 3*c* further comprises a controller 151 for controlling operation of the print module 3*a*, 3*b*, 3*c* and interfacing with other print modules 3*a*, 3*b*, 3*c* in the screen printing system.

Operation of the above-described screen printing system will now be described hereinbelow with reference to FIGS. 4(*a*) to (*g*) of the accompanying drawings.

In operation of the screen printing system, the input and output feed assemblies 38, 39 are continuously and automatically operated.

When the input walking beam 95 is in the lowered, outer position or the inner position, as illustrated in FIGS. 4(*a*) to (*c*) and 4(*e*) to (*g*), the input feed assembly 38 is continually operated such as to maintain a supply of workpieces W to any downstream print modules 3*a*, 3*b*, 3*c*, and also to ensure that a workpiece W is located at the loading station 38*a* on commencement of the loading cycle of the print station, as illustrated in FIG. 4(*d*).

When the output walking beam 135 is in the lowered, outer position or the inner position, as illustrated in FIGS. 4(*a*) to (*d*), (*f*) and (*g*), the output feed assembly 39 is continually operated such as to transfer workpieces W downstream, and also to ensure that the unloading station 39*a* is free to receive a workpiece W from the output transfer station 121 on commencement of the unloading cycle of the print station, as illustrated in FIG. 4(*e*).

FIG. 4(*a*) represents the configuration in which the print table 27 is supporting a workpiece W in the raised, printing position, and the walking beams 95, 135 of the input and output transfer units 85, 125 are each in the lowered, outer positions out of engagement with workpieces W, with the input walking beam 95 being located at the loading station 38*a* and the input transfer station 81 and the output walking beam 135 being located at the unloading station 39*a* and the output transfer station 121.

Figure 4A:
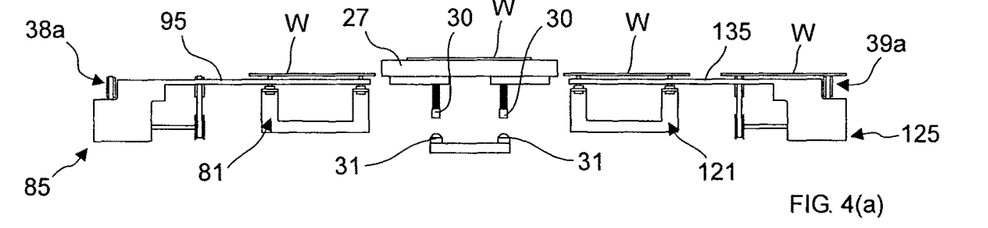
FIGS. 4(a) to (g) schematically represent the operation of one print module of the screen printing system of FIG. 1.

In this configuration, the workpiece W is fully supported by the print table 27 and held thereto by the application of vacuum to the vacuum section 28 thereof.

Following printing by the print unit 11, the vacuum is released from the vacuum section 28 of the print table 27, and, as illustrated in FIG. 4(*b*), the print table 27 is lowered to the lowered, loading/unloading position.

Figure 4B:
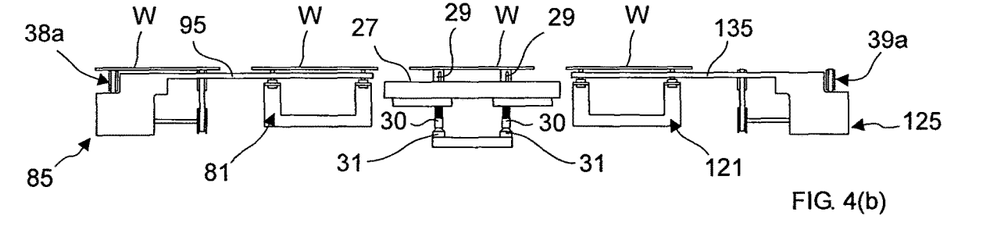
Figure 4C:
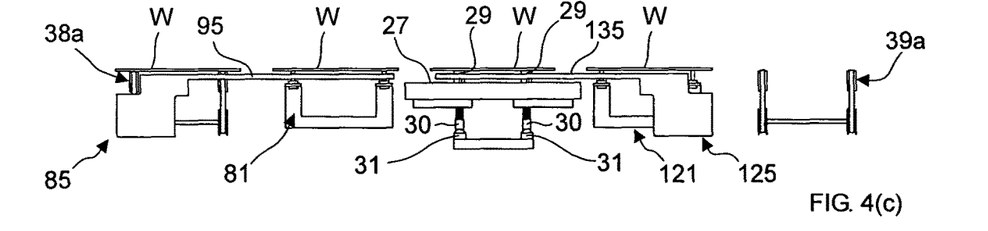

In lowering the print table 27 to the lowered, loading/unloading position, the resilient elements 30 of each of the workpiece support elements 29 are brought into engagement with respective ones of the stops 31, which acts to cause biasing, here compression, of the resilient elements 30, which causes the support elements 29 to extend above the upper surface of the print table 27, such as to support the workpiece W thereon in a loading/unloading position in which the workpiece W is spaced from the upper surface of the print table 27.

As illustrated in FIG. 4(*c*), the output transfer unit 125 is then operated, in this embodiment by actuating the horizontal drive mechanism 141 thereof, such as to move the output walking beam 135 horizontally inwardly to be located beneath workpieces W located on respective ones of the print station and the output transfer station 121.

As illustrated in FIG. 4(*d*), the input and output walking beams 95, 135 are then each raised to the raised positions, in this embodiment by operating the respective lifting mechanisms 97, 137, here simultaneously, which acts to lift the workpieces W located thereabove from the supporting structures, namely, the loading station 38*a*, the input transfer station 81, the print station and the output transfer station 121.

Figure 4D:
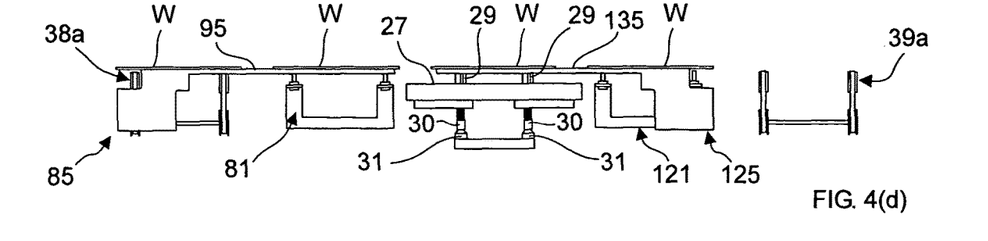

In this configuration, a vacuum is applied to the vacuum sections 103, 104, 143, 144 of the walking beams 95, 135, such that the workpieces W are held thereto.

As illustrated in FIG. 4(*e*), the input and output transfer units 85, 125 are then operated to move the walking beams 95, 135 thereof horizontally, in this embodiment by operation of the respective horizontal drive mechanisms 101, 141, here simultaneously, with the output walking beam 135 being moved outwardly, such that the workpieces W located at the print station and the output transfer station 121 are moved respectively to the output transfer station 121 and the unloading station 39*a*, and with the input walking beam 95 being moved inwardly, such that the workpieces W located at the input transfer station 81 and the loading station 38*a* are moved respectively to the print station and the input transfer station 81.

Figure 4E:
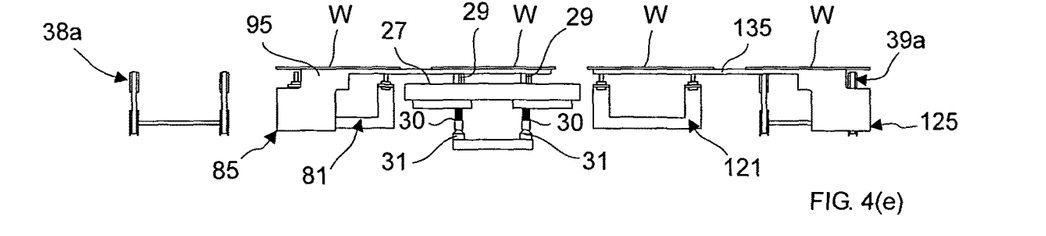
Figure 4F:
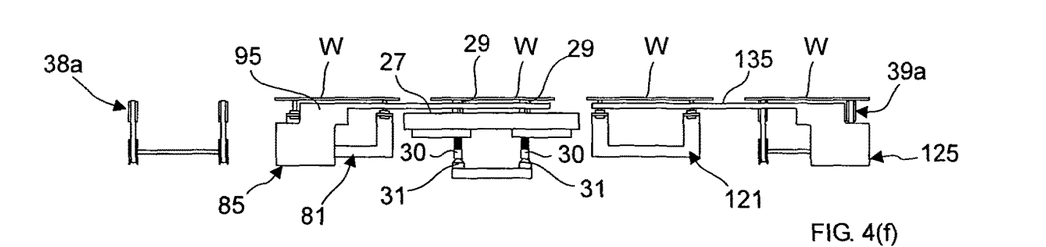
Figure 4G:
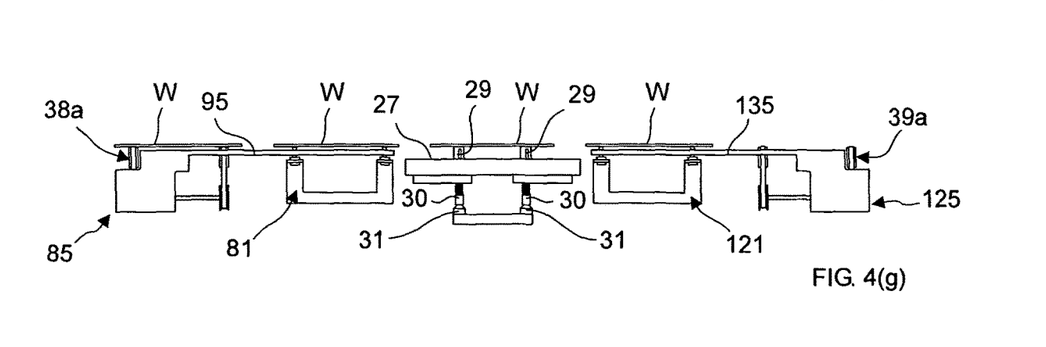

When in this configuration, the vacuum is released from the vacuum sections 103, 104, 143, 144 of the walking beams 95, 135.

As illustrated in FIG. 4(*f*), the input and output walking beams 95, 135 are then each lowered to the lowered positions, in this embodiment by operating the respective lifting mechanisms 97, 137, here simultaneously, which acts to lower the supported workpieces W onto the supporting structures therebelow, namely, the input transfer station 81, the print station, the output transfer station 121 and the unloading station 39*a*.

Following lowering of the input and output walking beams 95, 135, the input walking beam 95 is moved horizontally outwardly, in this embodiment by operation of the respective horizontal drive mechanism 101, such that the input walking beam 95 is located adjacent to loading station 38*a* and the input transfer station 81, as illustrated in FIG. 4(*g*).

This procedure can then be repeated in the same manner for subsequent workpieces W.

In the event that there is no workpiece W on the loading station 38*a* of the input feed assembly 38 of any of the print modules 3*a*, 3*b*, 3*c*, the input transfer unit 85 is still operated to transfer a workpiece W from the input transfer station 81 to the printing station.

In this embodiment the input and output transfer units 85, 125 are operated simultaneously, but in another embodiment can be operated independently.

In normal operation, each of the print modules 3*a*, 3*b*, 3*c* cycle synchronously. If, however, any of the print modules 3*a*, 3*b*, 3*c* is unable to print workpieces W, the input and output feed assemblies 38, 39 of the non-printing print modules 3*a*, 3*b*, 3*c* still function, so that workpieces W can still be fed to and from other of the print modules 3*a*, 3*b*, 3*c*.

This configuration results in only a proportional reduction in throughput in the event of a fault to one or more of the print modules 3*a*, 3*b*, 3*c*, because, rather than requiring complete closure of the line, the screen printing system of the present invention allows for continued operation of the functioning print modules 3*a*, 3*b*, 3*c*, thereby providing for an overall increase in the uptime of the line.

Figure 5:
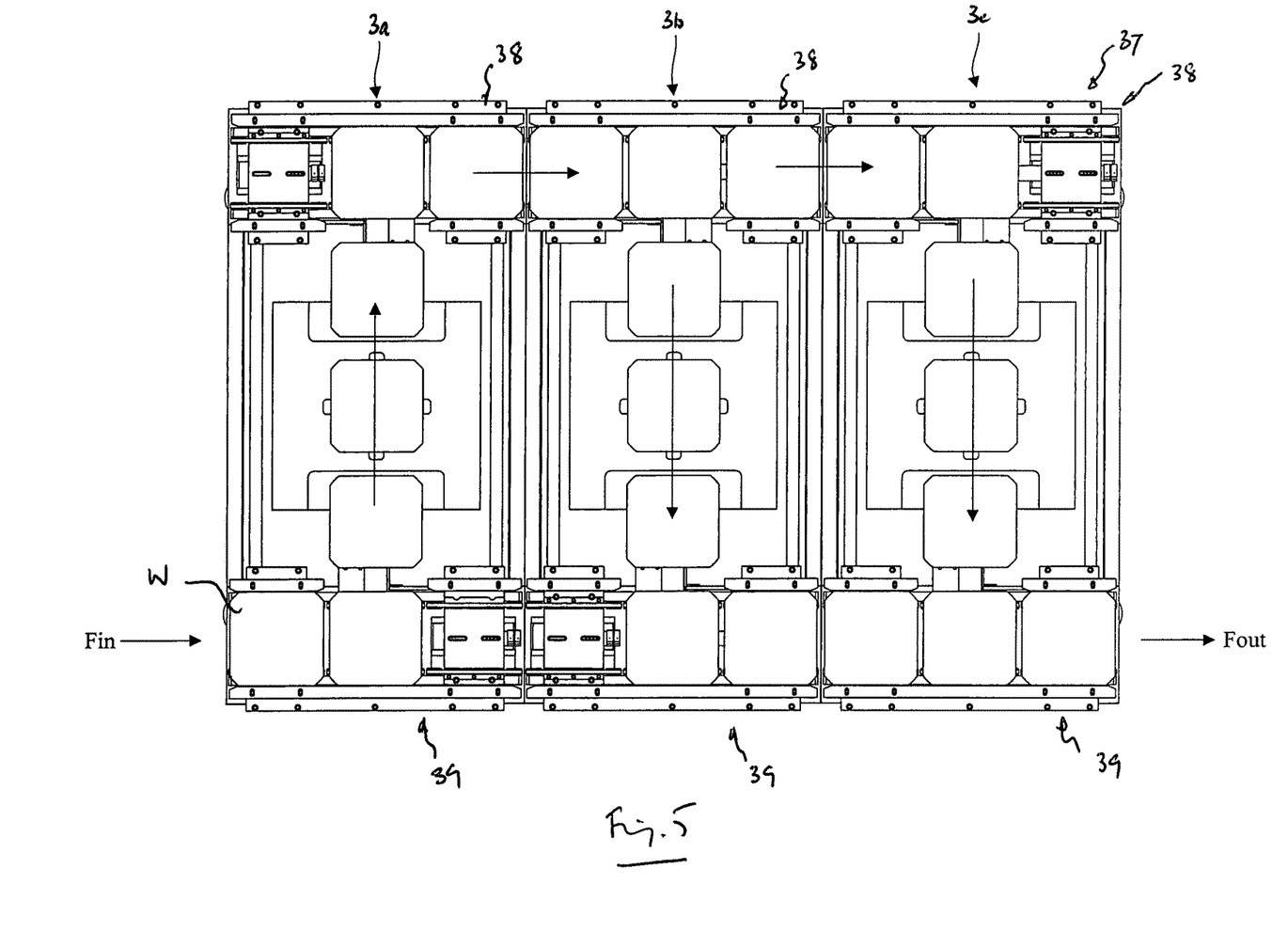
FIG. 5 illustrates a plan view of a screen printing system in accordance with a second embodiment of the present invention.

FIG. 5 illustrates a workpiece-processing system in accordance with a second embodiment of the present invention.

The workpiece-processing system of this embodiment is very similar to that of the above-described first embodiment, and thus, in order to avoid unnecessary duplication of description, only the differences will be described in detail, with like parts being designated by like reference signs.

The workpiece-processing system of this embodiment differs from that of the above-described workpiece-processing system in that at least one of the workpiece-processing modules 3*a*, 3*b*, 3*c*, in this embodiment the first workpiece-processing module 3*a*, provides a different workpiece-processing function to the other workpiece-processing modules 3*b*, 3*c*, whereby load balancing can be achieved between the different workpiece-processing modules 3*a*, 3*b*, 3*c*.

In this embodiment the workpiece-processing system comprises a ball-placement machine, where the first workpiece-processing module 3*a* comprises a printing module, as in the above-described embodiment, in which the workpiece-processing unit 11 comprises a print unit which is operable to print deposits of a print medium onto workpieces W, here of flux, and the second and third workpiece-processing modules 3*b*, 3*c* each comprise ball placement modules, in which the workpiece-processing units 11 comprise ball placement units, such as disclosed in WO-A-2000/054921, which are operable to place balls, here solder balls, on the printed deposits on respective ones of the workpieces W.

As illustrated, workpieces W are fed ($F_{in}$) to the first workpiece-processing module 3*a* along one, the second, feed assembly 39 and printed thereby, and then the printed workpieces W are selectively fed by operation of the other, first, feed assemblies 38 of the workpiece-processing modules 3*a*, 3*b*, 3*c* to ones of the second and third workpiece-processing modules 3*b*, 3*c* to place balls on the printed deposits on respective ones of the workpieces W, and subsequently fed ($F_{out}$) downstream by the one, second, feed assemblies 39 of the second and third workpiece-processing modules 3*b*, 3*c*, typically to a re-flow oven to melt the balls and form connection bumps on the workpieces W.

With this configuration, the loading of the first workpiece-processing module 3*a*, as a print module, is balanced to the loading of the second and third workpiece-processing modules 3*b*, 3*c*, as ball placement modules, in that a printer can typically keep pace with two or more ball placers, thereby maximizing the throughput of the workpiece-processing system.

It will be understood that the present invention has application to workpiece-processing modules 3 of any kind and in any number, and allows for active re-configuration of the processing paths of workpieces W, for example, where workpiece-processing modules 3 go off line. This active re-configuration of the workpiece pathways is particularly effective where the workpiece-processing system includes multiple ones of each kind of workpiece-processing module 3.

Figure 6:
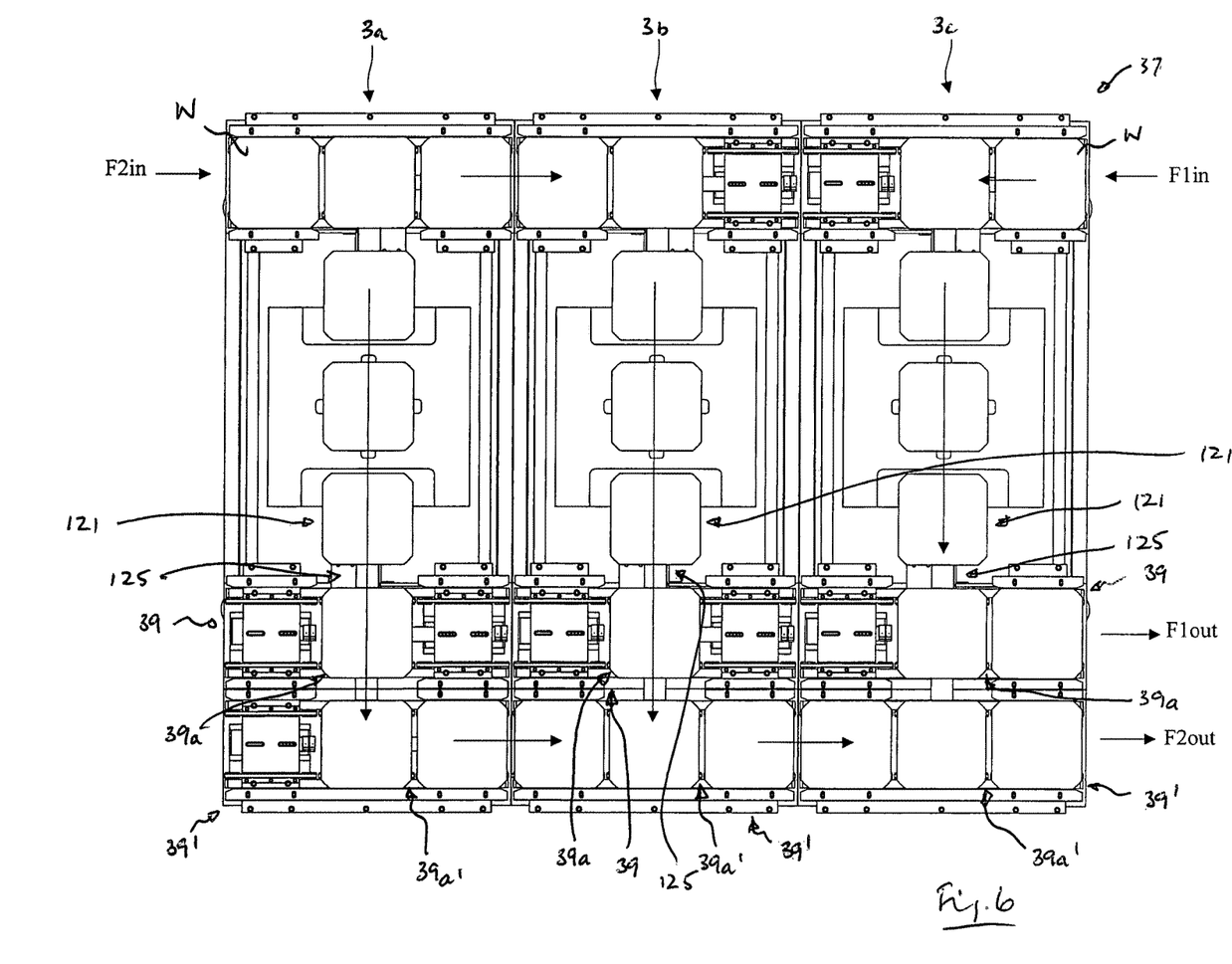
FIG. 6 illustrates a plan view of a screen printing system in accordance with a third embodiment of the present invention.

FIG. 6 illustrates a workpiece-processing system in accordance with a third embodiment of the present invention.

The workpiece-processing system of this embodiment is quite similar to that of the above-described first embodiment, and thus, in order to avoid unnecessary duplication of description, only the differences will be described in detail, with like parts being designated by like reference signs.

The workpiece-processing system of this embodiment differs from that of the above-described first embodiment in that the feed unit 37 comprises first and second rear feed assemblies 39, 39', which together provide first and second output lines, which provide first and second workpiece feeds $F1_{out}$, $F2_{out}$, such as for dual lane production, with the output transfer units 125 of the workpiece-processing modules 3*a*, 3*b*, 3*c* each being modified to transfer workpieces W from the print station to the output transfer station 121, from the output transfer station 121 to the unloading station 39*a* of the first, inner rear feed assembly 39 and from the unloading station 39*a* of the first, inner rear feed assembly 39 to the unloading station 39*a'* of the second, outer rear feed assembly 39'.

In this embodiment the output transfer units 125 of the workpiece-processing modules 3*a*, 3*b*, 3*c* are operated selectively to provide workpieces W to the first and second rear feed assemblies 39, 39' thereof, in dependence upon the requirements of the first and second workpiece feeds $F1_{out}$, $F2_{out}$.

In this embodiment the output transfer units 125 of the first and second workpiece-processing modules 3*a*, 3*b* are operated to provide workpieces W to the second, outer rear feed assemblies 39' thereof, and the third workpiece-processing module 3*c* is operated to provide workpieces W to the first, inner rear feed assembly 39 thereof.

The workpiece-processing system of this embodiment also differs from that of the above-described first embodiment in that two input workpiece feeds $F1_{in}$, $F2_{in}$ are provided to the feed unit 37. In this embodiment the workpieces W in the respective ones of the input workpiece feeds $F1_{in}$, $F2_{in}$ are different, but in another embodiment could be the same.

In this embodiment separate input workpiece feeds $F1_{in}$, $F2_{in}$ are provided to ones of the workpiece-processing modules 3*a*, 3*b*, 3*c*.

In this embodiment the input workpiece feeds $F1_{in}$, $F2_{in}$ are provided respectively to the third workpiece-processing module 3*c* and the first and second workpiece-processing modules 3*a*, 3*b*, with the first input workpiece feed $F1_{in}$ being supplied to the front feed assembly 38 of the third workpiece-processing module 3*c* and the second input workpiece feed $F2_{in}$ being supplied to the front feed assembly 38 of the first workpiece-processing module 3*a* and the front feed assembly 38 of the second workpiece-processing module 3*b* by selective operation of the front feed assemblies 38 of the first and second workpiece-processing modules 3*a*, 3*b*.

In one embodiment the workpiece-processing modules 3*a*, 3*b*, 3*c* can provide for different operations on the workpieces W, such as different printing operations.

In this embodiment the first and second workpiece-processing modules 3*a*, 3*b* provide for the same operation on the workpieces W, here the same printing operation, and the third workpiece-processing module 3*c* provides for a different printing operation to the first and second workpiece-processing modules 3*a*, 3*b*.

Figure 7:
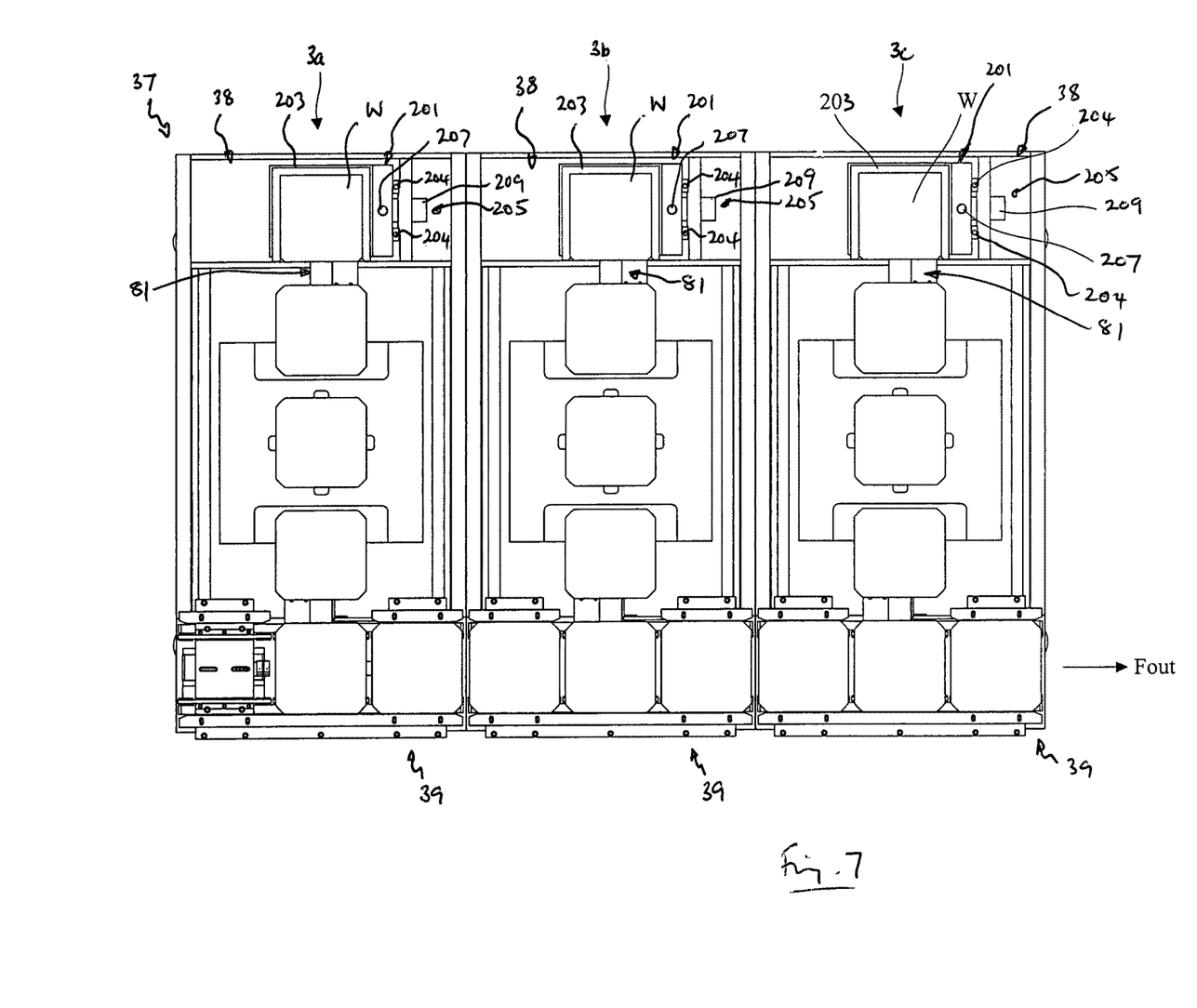
FIG. 7 illustrates a plan view of a screen printing system in accordance with a fourth embodiment of the present invention.

FIG. 7 illustrates a workpiece-processing system in accordance with a fourth embodiment of the present invention.

The workpiece-processing system of this embodiment is quite similar to that of the above-described first embodiment, and thus, in order to avoid unnecessary duplication of description, only the differences will be described in detail, with like parts being designated by like reference signs.

The workpiece-processing system of this embodiment differs from that of the above-described first embodiment in that the front feed assembly 38 of the feed unit 37 of each workpiece-processing module 3a, 3b, 3c comprises a separate cassette feed mechanism 201.

The cassette feed mechanism 201 comprises a cassette 203 which holds a plurality of workpieces W, which can be individually removed therefrom. In this embodiment the cassette 203 includes a plurality of individual slots in which the workpieces W are stacked.

In this embodiment the cassette 203 is supported by linear bearings 204, which act to fix the lateral position of the cassette 203 and provide only for vertical movement of the cassette 203.

The cassette feed mechanism 201 further comprises a drive unit 205, in this embodiment an elevator platform, which is operative to move the cassette 203 vertically between predetermined positions, such that the cassette 203 provides an upline buffer station which buffers a workpiece W for transfer downstream by the input transfer station 81, which is operative to withdraw the buffered workpiece W from the cassette 203. In this embodiment, in operation, the cassette 203 is raised to a maximum height and successively lowered, such that a successive one of the workpieces W is presented to the input transfer station 81.

In this embodiment the drive unit 205 comprises a leadscrew 207 which is coupled to the cassette 203, and an actuator 209, here a motor and associated gearbox assembly, which is operative to drive the leadscrew 207 to move the cassette 203 between the predetermined positions, such that a workpiece W is successively buffered to the input transfer station 81.

In this embodiment the rear feed assemblies 39 of the workpiece-processing modules 3a, 3b, 3c provide a single, common output workpiece feed $F_{out}$.

Figure 8:
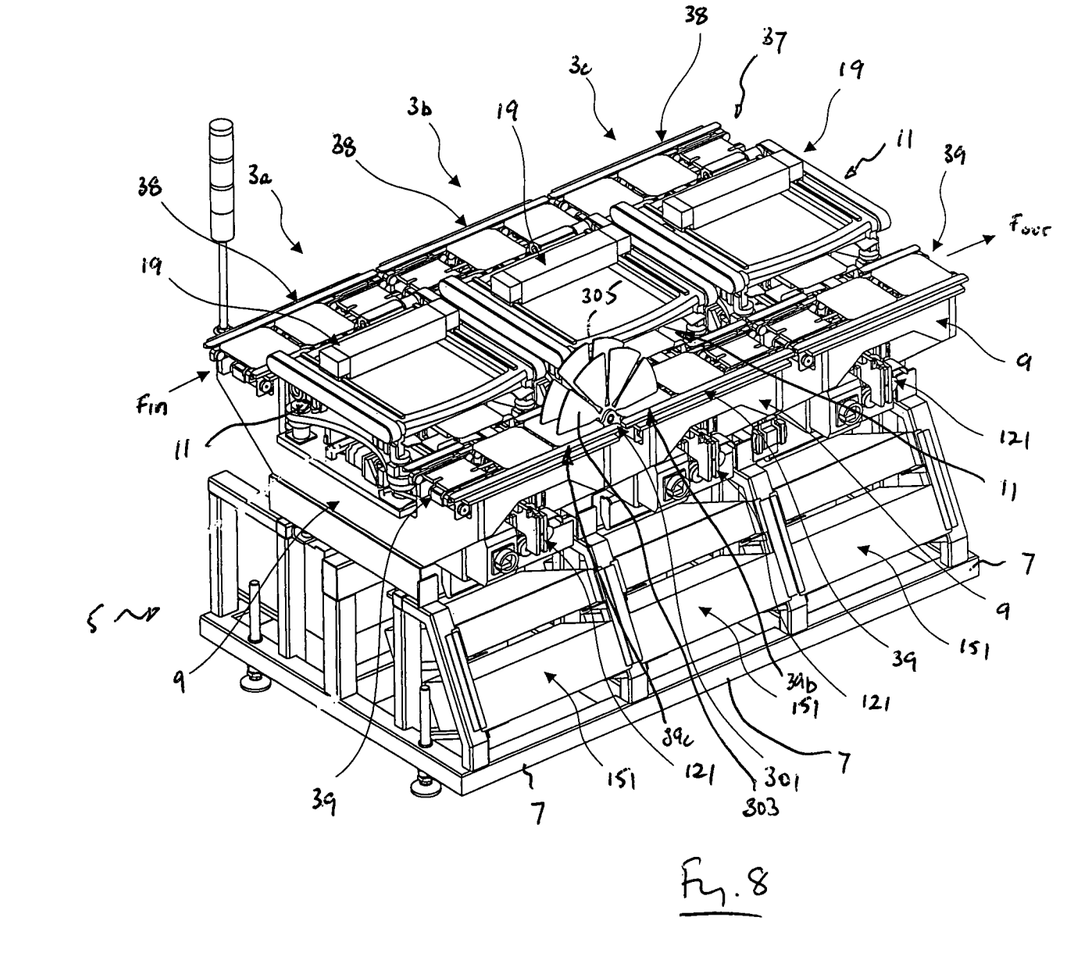
FIG. 8 illustrates a perspective view of a screen printing system in accordance with a fifth embodiment of the present invention.
Figure 9:
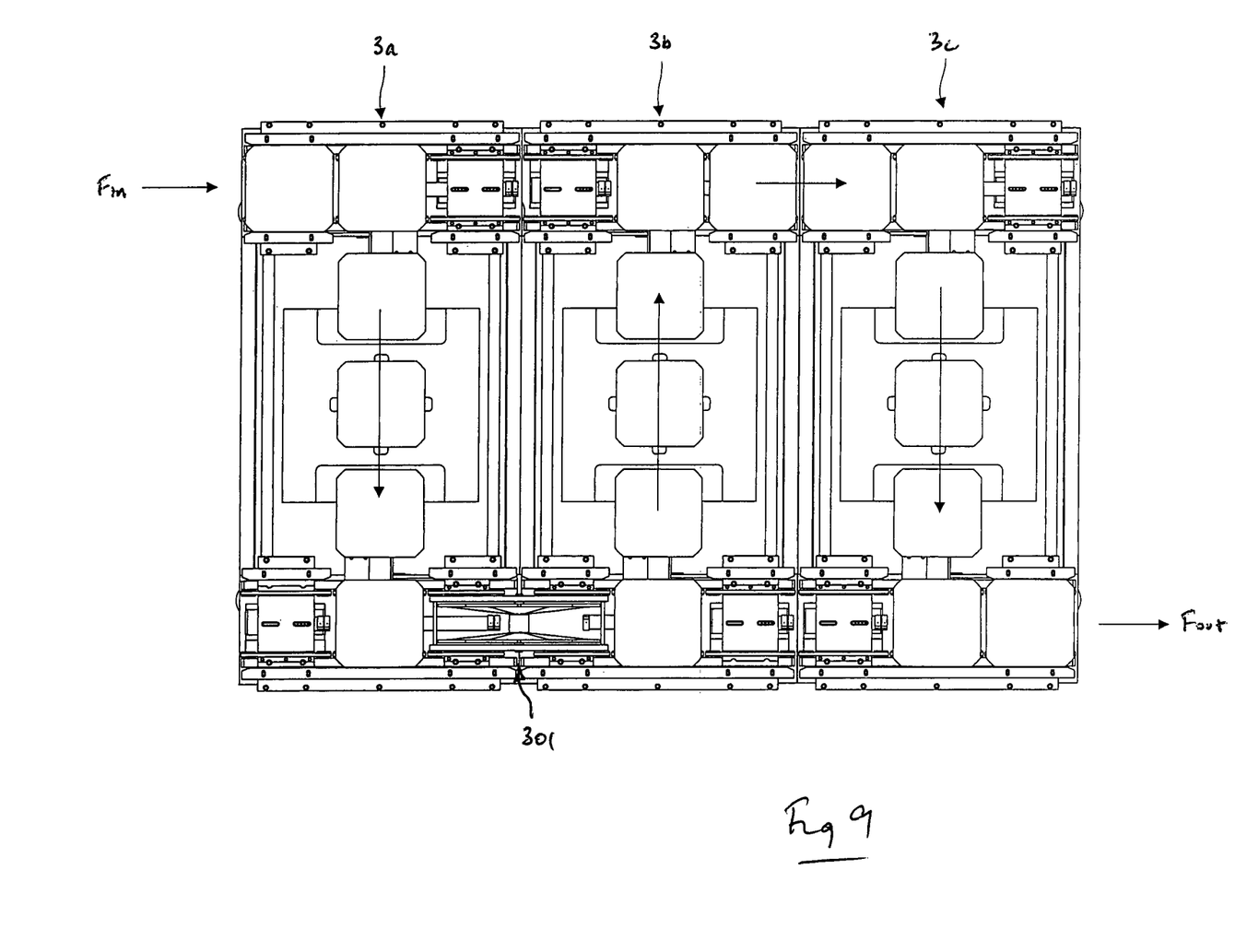
FIG. 9 illustrates a plan view of the screen printing system of FIG. 8.

FIGS. 8 and 9 illustrate a workpiece-processing system in accordance with a fifth embodiment of the present invention.

The workpiece-processing system of this embodiment is quite similar to that of the above-described first embodiment, and thus, in order to avoid unnecessary duplication of description, only the differences will be described in detail, with like parts being designated by like reference signs.

The workpiece-processing system of this embodiment differs from that of the above-described first embodiment in that the workpiece-processing system is configured for holt-melt printing onto wafers, in this embodiment solar cell wafers, as the workpieces W.

In this embodiment the workpiece-processing units 11, as print units, of the first and second workpiece-processing modules 3a, 3b are configured for holt-melt printing onto wafers. Specifically, in each of the first and second workpiece-processing modules 3a, 3b, the printing screen PS, the print head 19, here squeegees, and the print table 27 are heated, here to a temperature between 60 and 100 C.

The workpiece-processing system of this embodiment further differs from that of the above-described first embodiment in comprising an inverting device 301 for inverting workpieces W to provide for printing on both lower and upper sides of the workpieces W.

In this embodiment the inverting device 301 is located between ones of feed assemblies 38, 39 of adjacent workpiece-processing modules 3a, 3b, 3c, here the rear feed assemblies 39 of the first and second workpiece-processing modules 3a, 3b. This configuration, with the workpiece-processing modules 3a, 3b, 3c being configured in series, advantageously provides for hot-melt printing of wafers with a printing machine which has a footprint of a similar size to a conventional printing machine. It will be understood, however, that the inverting device 301 can be alternatively located.

In this embodiment the inverting device 301 comprises a flipper, as a rotatable element 303, here in the form of wheel, which includes at least one pair of oppositely-directed slots 305 for receiving workpieces W therein. The rotatable element 303 is configured such that a slot 305, when located at the downline buffer sub-feed assembly 39c of the rear feed assembly 39 of the first workpiece-processing module 3a, receives a workpiece W therein by operation of the rear feed assembly 39 of the first workpiece-processing module 3a, and, by rotation of the rotatable element 303, such that a slot 305, when located at the upline buffer sub-feed assembly 39b of the rear feed assembly 39 of the second workpiece-processing module 3b, presents a workpiece W in an inverted orient to be fed by operation of the rear feed assembly 39 of the second workpiece-processing module 3b.

In this embodiment, by providing at least one pair of oppositely-directed slots 305 in the rotatable element 303, the feed assemblies 39 of the first and second workpiece-processing modules 3a, 3b can operate simultaneously on two workpieces W.

In this embodiment the rotatable element 303 includes a plurality of pairs of oppositely-directed slots 305, which allows for workpieces W to be buffered on the rotatable element 303.

In this embodiment the workpiece-processing system, as a solar cell printing machine, provides for the printing of contact fingers on solar cells.

In a first step, an input workpiece feed $F_{in}$ is fed to the front feed assembly 38 of the first workpiece-processing module 3a, which is operative to print a fine silver collector array on the upper surface of a workpiece W using a silver paste having a first melting point, here towards the upper end of the mentioned range.

The printed workpiece W is then transferred to the rear feed assembly 39 of the first workpiece-processing module 3a, by which time the print will have dried sufficiently to allow for handling.

A first printed workpiece W is transferred by the rear feed assembly 39 to the inverting device 301, in this embodiment being located in a slot 305 in the rotatable element 303, and the rotatable element 303 is rotated to present a workpiece W in an inverted orient to the rear feed assembly 39 of the second workpiece-processing module 3b.

A first printed and inverted workpiece W is then printed by the second workpiece-processing module 3b, which is operative to print bus bars on the other, lower surface of a workpiece W using a silver-aluminum compound having a second melting point, lower than the melting point of the silver paste.

A second printed workpiece W is transferred by the front feed assemblies 38 of the second and third workpiece-processing modules 3b, 3c to the third workpiece-processing module 3c.

A second printed workpiece W is then printed by the third workpiece-processing module 3c, which is operative to print a back side field on the other, lower surface of a workpiece W using an aluminum compound.

A third printed workpiece W is then transferred downstream by the rear feed assembly 39 of the third workpiece-processing module 3c, here in an output workpiece feed $F_{out}$ directly to a firing furnace.

Finally, it will be understood that the present invention has been described in its preferred embodiments and can be modified in many different ways without departing from the scope of the invention as defined by the appended claims.

For example, although exemplified in relation to print modules 3, the present invention has application in relation to any workpiece-processing modules, including ball placement modules and pick-and-place modules.

The invention claimed is:

1. A workpiece processing system comprising a plurality of workpiece processing modules, each comprising a workpiece processing unit for processing workpieces and a feed unit for transferring workpieces to and from the workpiece processing unit, wherein the feed units together provide at least one common output workpiece feed along which workpieces are transferred from the workpiece processing units of each of the workpiece processing modules.

2. The workpiece processing system of claim 1, comprising at least three workpiece processing modules.

3. The workpiece processing system of claim 1, wherein the workpiece processing modules comprise print modules.

4. The workpiece processing system of claim 1, wherein at least one of the workpiece processing modules has a different function.

5. The workpiece processing system of claim 4, wherein at least one workpiece processing module comprises a printer and at least one workpiece processing module comprises a ball placer.

6. The workpiece processing system of claim 5, wherein at least one workpiece processing module comprises a printer and a plurality of workpiece processing modules comprise ball placers.

7. The workpiece processing system of claim 1, comprising an inverting device for inverting a workpiece, whereby ones of the workpiece processing modules provide for operation on different sides of the workpieces.

8. The workpiece processing system of claim 1, wherein the feed unit comprises input and output feed assemblies for transferring workpieces to and from the workpiece processing unit and a processing zone feed assembly which interconnects the input and output feed assemblies for transferring workpieces from the input feed assembly to the workpiece processing unit and from the workpiece processing unit to the output feed assembly.

9. The workpiece processing system of claim 8, wherein the workpiece processing modules are disposed in parallel relation, such that respective ones of the input and output feed assemblies of the modules are connected together and define infeed and outfeed lines, and each module is separately operable to process workpieces.

10. The workpiece processing system of claim 8, comprising a single input workpiece feed.

11. The workpiece processing system of claim 8, comprising a single output workpiece feed.

12. The workpiece processing system of claim 8, comprising at least two input workpiece feeds.

13. The workpiece processing system of claim 8, comprising at least two output workpiece feeds.

14. A method of processing workpieces using the workpiece processing system of claim 1.

15. The workpiece processing system of claim 1, wherein the workpiece processing modules comprise print modules.

16. The workpiece processing system of claim 15, comprising a hot-melt processing system for printing on wafers.

17. The workpiece processing system of claim 16, comprising three workpiece printing modules, wherein first and second of the printing modules provide for hot-melt printing on workpieces, and an inverting device for inverting workpieces between the first and second printing modules.

18. A method of processing workpieces, comprising the steps of:
providing a plurality of workpiece processing modules, each comprising a workpiece processing unit for processing workpieces and a feed unit for transferring workpieces to and from the processing unit, wherein the feed units together provide at least one common workpiece feed along which workpieces are transferred from the workpiece processing units of each of the workpiece processing modules; and
transferring workpieces to and from the workpiece processing units and along the at least one common output workpiece feed.

19. The method of claim 18, wherein the workpiece processing modules comprise print modules.

20. The method of claim 19, wherein the method is for hot-melt processing on wafers.

21. The method of claim 20, comprising three workpiece printing modules, wherein first and second of the printing modules provide for hot-melt printing on workpieces, and further the steps of:
transferring workpieces in series between the workpiece printing modules; and
inverting workpieces between the first and second printing modules.

22. The method of claim 18, wherein at least one of the workpiece processing modules has a different function.

23. The method of claim 22, wherein the method is a method of ball placement, and at least one workpiece processing module comprises a printer and at least one workpiece processing module comprises a ball placer.

24. The method of claim 23, wherein at least one workpiece processing module comprises a printer and a plurality of workpiece processing modules comprise ball placers.

25. The method of claim 18, further comprising the step of:
inverting the workpieces and operating on different sides of the workpieces.

26. The method of claim 18, wherein the feed unit comprises input and output feed assemblies for transferring workpieces to and from the workpiece processing unit and a processing zone feed assembly which interconnects the input and output feed assemblies for transferring workpieces from the input feed assembly to the workpiece processing unit and from the workpiece processing unit to the output feed assembly.

27. The method of claim 26, comprising a single input workpiece feed.

28. The method of claim 26, comprising a single output workpiece feed.

29. The method of claim 26, comprising at least two input workpiece feeds.

30. The method of claim 26, comprising at least two output workpiece feeds.

31. The method of claim 18, wherein the workpiece processing modules are disposed in parallel relation, and respective ones of the input and output feed assemblies of the modules are connected together and define infeed and outfeed lines.

32. The method of claim 18, comprising at least three workpiece processing modules.

* * * * *